(12) United States Patent
Song et al.

(10) Patent No.: US 11,984,457 B2
(45) Date of Patent: May 14, 2024

(54) TFT ARRAY SUBSTRATE, PREPARATION METHOD THEREOF, AND DISPLAY DEVICE

(71) Applicant: BOE Technology Group Co., Ltd., Beijing (CN)

(72) Inventors: Youngsuk Song, Beijing (CN); Wei Liu, Beijing (CN); Hongda Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 216 days.

(21) Appl. No.: 17/378,576

(22) Filed: Jul. 16, 2021

(65) Prior Publication Data
US 2022/0223629 A1 Jul. 14, 2022

(30) Foreign Application Priority Data
Jan. 12, 2021 (CN) .......................... 202110038504.2

(51) Int. Cl.
*H01L 27/12* (2006.01)
*H01L 29/66* (2006.01)
*H01L 29/786* (2006.01)

(52) U.S. Cl.
CPC ...... *H01L 27/1251* (2013.01); *H01L 27/1259* (2013.01); *H01L 29/66742* (2013.01); *H01L 29/78618* (2013.01)

(58) Field of Classification Search
CPC ......... H01L 29/78648; H01L 29/78633; H01L 29/41733; H01L 29/7869
See application file for complete search history.

(56) References Cited

U.S. PATENT DOCUMENTS

| 5,140,391 | A | * | 8/1992 | Hayashi | ............ H01L 29/78648 257/365 |
| 2003/0062523 | A1 | * | 4/2003 | Bae | .................. H01L 29/41733 257/72 |
| 2014/0183476 | A1 | * | 7/2014 | Kwon | ................. H01L 29/7869 257/43 |
| 2015/0303306 | A1 | * | 10/2015 | Choi | ................... H01L 29/7869 257/43 |
| 2016/0027812 | A1 | | 1/2016 | Kim et al. | |
| 2020/0251596 | A1 | | 8/2020 | Su et al. | |

FOREIGN PATENT DOCUMENTS

| CN | 103730475 A | 4/2014 |
| CN | 109686793 A | 4/2019 |
| CN | 110265483 A | 9/2019 |
| CN | 110993651 A | 4/2020 |
| CN | 111508976 A | 8/2020 |

OTHER PUBLICATIONS

CN202110038504.2 first office action.

* cited by examiner

*Primary Examiner* — Peter M Albrecht
(74) *Attorney, Agent, or Firm* — IPro, PLLC

(57) ABSTRACT

A thin-film transistor (TFT) array substrate, a preparation method thereof, and a display device are provided. The TFT array substrate includes a source, a drain, and a first gate; wherein a protrusive structure is defined between the source and the drain, and the first gate is disposed inside the protrusive structure; and in a plane where a surface of the first gate is disposed, a sum of an overlapped area of a projection of the source and a projection of the first gate and an overlapped area of a projection of the drain and the projection of the first gate is less than an area threshold.

17 Claims, 6 Drawing Sheets

TFT ARRAY SUBSTRATE, PREPARATION METHOD THEREOF, AND DISPLAY DEVICE

CROSS-REFERENCE TO RELATED APPLICATION

This application is based on and claims priority to Chinese Patent Application No. 202110038504.2, filed on Jan. 12, 2021, the disclosure of which is herein incorporated by reference in its entirety.

TECHNICAL FIELD

The present disclosure relates to the field of semiconductor manufacturing technologies, and relates to a thin-film transistor (TFT) array substrate, a preparation method thereof, and a display device.

BACKGROUND

Thin-film transistor liquid crystal display (TFT-LCD) based on TFT array substrate has merits over any other flat panel display and cathode ray tube (CRT), such as thin size, light weight, excellent picture quality, low power consumption, long life, digitalization, and the like. With these merits, the TFT-LCDs are widely used in various large, medium and small size products, and the TFT-LCDs are gradually replacing traditional cathode ray tube displays, quickly entering people's daily life, and almost covering the main electronic products in today's information society, such as televisions, monitors, portable computers, mobile phones, personal digital assistants (PDA), global positioning system (GPS), vehicle displays, instruments, public displays, medical displays, and the like.

However, since the liquid crystal display is a passive display device that relies on an electric field to adjust the arrangement of liquid crystal molecules to achieve luminous flux modulation, a fine active drive array is required to adapt to the deflection of the liquid crystal in each pixel region.

SUMMARY

Embodiments of the present disclosure provide a TFT array substrate, a preparation method thereof, and a display device.

In one aspect of the embodiments of the present disclosure, a TFT array substrate is provided. The TFT array substrate includes a source, a drain, and a first gate; wherein a protrusive structure is defined between the source and the drain, and the first gate is disposed inside the protrusive structure; and in a plane where a surface of the first gate is disposed, a sum of an overlapped area of a projection of the source and a projection of the first gate and an overlapped area of a projection of the drain and the projection of the first gate is less than an area threshold.

In some embodiments, the area threshold is not greater than 20% of a sum of areas of the projection of the source, the projection of the drain, and the projection of the first gate.

In some embodiments, the sum of the overlapped area of the projection of the source and the projection of the first gate and the overlapped area of the projection of the drain and the projection of the first gate is zero.

In some embodiments, the source and the drain each include a main body, a longitudinal extension and a lateral extension, wherein the longitudinal extension of the source is connected to a side, facing the drain, of the main body of the source, the longitudinal extension of the drain is connected to a side, facing the source, of the main body of the drain, and the lateral extension is connected to a top of the longitudinal extension.

In some embodiments, in the plane where the surface of the first gate is disposed, a distance between a projection of an inner edge of the lateral extension of the source and a projection of a side edge, proximal to the inner edge of the lateral extension of the source, of the first gate is less than a distance threshold, and a distance between a projection of an inner edge of the lateral extension of the drain and a projection of a side edge, proximal to the inner edge of the lateral extension of the drain, of the first gate is less than the distance threshold.

In some embodiments, the TFT array substrate further includes an active layer, wherein the drain and the source are in contact with the active layer through via holes provided on the first interlayer dielectric layer.

In some embodiments, a first gate insulating layer is disposed between the first gate and the active layer, and a second interlayer dielectric layer is filled around the first gate and the first gate insulating layer in the protrusive structure.

In some embodiments, the TFT array substrate further includes a substrate, wherein a light-shielding layer and a first planarization layer are disposed on the substrate, wherein the first planarization layer covers the light-shielding layer.

In some embodiments, a first buffer layer is disposed between the first planarization layer and the active layer.

In some embodiments, the TFT array substrate further includes a substrate and a second gate, wherein the substrate is provided with a boss mated with the second gate, and the second gate covers the boss.

In some embodiments, the second gate is disposed at a corresponding position on a side, proximal to the substrate, of the protrusive structure, wherein a width of the second gate is less than a width of a channel formed by the source and the drain on the active layer.

In some embodiments, the second gate covers a side surface of the boss and extends on the substrate to an outside of the boss.

In another aspect of the embodiments of the present disclosure, a method for preparing a TFT array substrate is provided. The method includes: forming a source, a drain, and a first gate; wherein a protrusive structure is defined between the source and the drain, and the first gate is disposed inside the protrusive structure; and in a plane where a surface of the first gate is disposed, a sum of an overlapped area of a projection of the source and a projection of the first gate and an overlapped area of a projection of the drain and the projection of the first gate is less than an area threshold.

In some embodiments, the area threshold is not greater than 20% of a sum of areas of the projection of the source, the projection of the drain, and the projection of the first gate.

In some embodiments, the sum of the overlapped area of the projection of the source and the projection of the first gate and the overlapped area of the projection of the drain and the projection of the first gate is zero.

The TFT array substrate preparation method is employed to prepare the TFT array substrate as described above.

In some embodiments, the method includes: forming a light-shielding layer on a substrate; applying spin-on silicate glass coating as a first planarization layer on the substrate and the light-shielding layer; forming a first buffer layer on the first planarization layer; forming an active layer on the first buffer layer; forming a first gate insulating layer on the active layer; preparing a metal electrode on the first gate insulating layer as a first gate; forming an interlayer dielectric layer above the buffer layer or the second gate insulating layer, and forming via holes for the drain and the source to be in contact with the buffer layer while forming the interlayer dielectric layer, wherein the interlayer dielectric layer covers the first gate and the first gate insulating layer; and forming and patterning a source-drain metal layer, wherein the pattern of the source-drain metal layer includes a source and a drain, wherein the source and the drain each include a main body formed by a via hole on the interlayer dielectric layer, a longitudinal extension disposed on an opposite side of the main body of the source and the drain, and a lateral extension disposed on a top of the longitudinal extension.

In some embodiments, the TFT array substrate further includes a second gate disposed on the substrate, the substrate includes a boss mated with the second gate, wherein the second gate covers the boss.

In some embodiments, the second gate is disposed at a corresponding position on a side, proximal to the substrate, of the protrusive structure, wherein a width of the second gate is less than a width of a channel formed by the source and the drain on the active layer.

In some embodiments, a second buffer layer or a second gate insulating layer is disposed between the second gate and the active layer.

In some embodiments, a second planarization layer is disposed between the second buffer layer or the second gate insulating layer and the substrate, wherein the second planarization layer does not cover an upper surface of the second gate.

In some embodiments, the second gate covers a side surface of the boss and extends on the substrate to the outside of the boss on the substrate.

In some embodiments, the method includes: forming a boss on a substrate; forming a second gate on the boss; applying spin-on silicate glass coating as a second planarization layer on the substrate, wherein the second planarization layer does not cover an upper surface of the second gate; forming a second buffer layer or a second gate insulating layer on an upper surface of the second planarization layer and an upper surface of the second gate; forming an active layer on the second buffer layer or the second gate insulating layer; forming a first gate insulating layer on the active layer, and preparing a metal electrode on the first gate insulating layer as a first gate; forming an interlayer dielectric layer above the buffer layer or the second gate insulating layer, and forming via holes for the drain and the source to be in contact the buffer layer while forming the interlayer dielectric layer, wherein the interlayer dielectric layer covers the first gate and the first gate insulating layer; and forming and patterning a source-drain metal layer, wherein the pattern of the source-drain metal layer includes a source and a drain, wherein the source and the drain each include a main body formed by a via hole on the interlayer dielectric layer, a longitudinal extension disposed on an opposite side of the main body of the source and the drain, and a lateral extension disposed on the top of the longitudinal extension.

In some embodiments, the substrate is a glass substrate, and the method for forming the boss on the substrate includes: forming the boss by etching; or forming the boss by photolithography using a high heat-resistant adhesive material.

In some embodiments, the substrate is a plastic substrate, and the method for forming the boss on the substrate includes: forming the boss by half-tone exposure using a photosensitive PI material; or removing other parts of the substrate outside the boss by dry etching using a photomask; or forming the boss by a nanoimprint method.

In another aspect of the embodiments of the present disclosure, a display device is provided. The display device includes the TFT array substrate as described above.

DETAILED DESCRIPTION

The present disclosure is further described in detail hereinafter with reference to the accompanying drawings and embodiments. It is understood that the embodiments described herein are merely intended to explain the related invention, but not to limit the invention. In addition, it should also be noted that, for ease of description, only the parts related to the invention are shown in the accompanying drawings.

In the related art, the conductivity of the conductive channel of the active layer can be improved by increasing the gate area of the TFT or using a double-gate thin-film transistor. Among them, double-gate thin-film transistors are widely used for their advantages such as not reducing the aperture ratio of the array substrate, and at the same time improving the conductivity of the conductive channel of the active layer.

However, whether it is to increase the gate area or use a double-gate structure, parasitic capacitance and parasitic voltage may be generated, such as the parasitic capacitance between the gate and the source or the drain, and the parasitic capacitance between the bottom gate and the active layer in the double-gate structure. In the case of the top gate, the parasitic capacitance and parasitic voltage between the top gate and the source and the drain can be controlled by the self-aligned design of the top gate. However, in the case of the bottom gate, only a buffer layer on the bottom gate is used in the related art, but the buffer layer cannot prevent the coverage area of the bottom gate and the active layer from generating parasitic voltage or parasitic capacitance.

It should be noted that the embodiments in the present disclosure and the features in the embodiments can be combined with each other if there is no conflict. Hereinafter, the present disclosure is described in detail with reference to the accompanying drawings and in conjunction with the embodiments.

Figure 1:
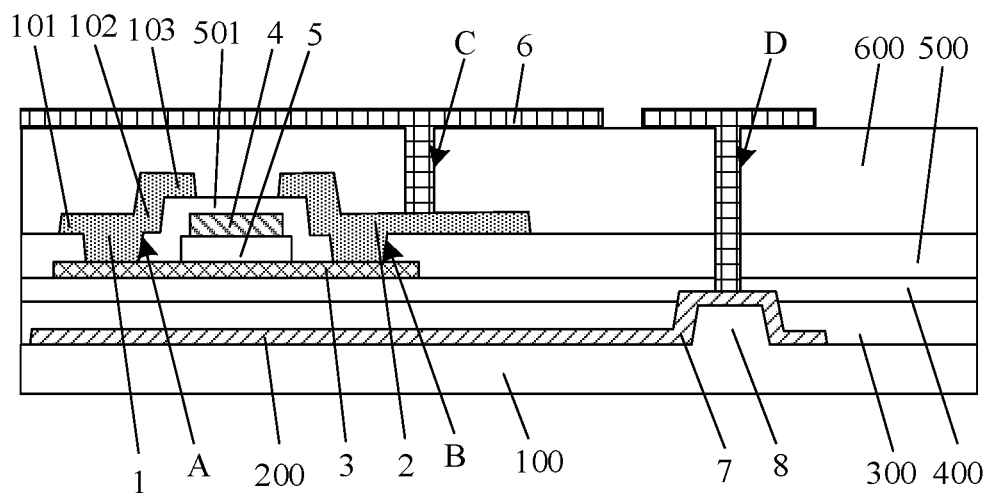
FIG. 1 is a schematic structural diagram of a TFT array substrate according to an embodiment of the present disclosure.

Referring to FIG. 1, the present disclosure provides a TFT array substrate. The TFT array substrate includes a source 2, a drain 1, and a first gate 4. A protrusive structure is defined between the source 2 and the drain 1. The first gate 4 is provided inside the protrusive structure. That is, the first gate 4 is disposed inside the protrusive structure.

In a plane where a surface of the first gate 4 is disposed, projections of the source 2 and the drain 1 are not overlapped with or are approximately not overlapped with a projection of the first gate 4. That is, a sum of an overlapped area of the projection of the source and the projection of the first gate and an overlapped area of the projection of the drain and the projection of the first gate is less than an area threshold.

The surface of the first gate 4 refers to a top or bottom surface of the first gate 4, rather than a side surface of the first gate. The "projection" referred to in the embodiments of the present disclosure is orthographic projection.

The technical solutions according to the embodiments of the present disclosure may include the following beneficial effects.

In the TFT array substrate according to the embodiment of the present disclosure, an upward protrusive structure is defined between the drain and the source, and the top gate is disposed in the protrusive structure to control the coverage area between the top gate and the source and the drain, such that the opposite portions between the top gate and the source-drain are relatively small, thereby controlling the generation of parasitic capacitance and parasitic voltage. This design can be applied to a narrow channel or a wide channel. At the same time, the design is also suitable for a double-gate structure, which increases the off-state current by applying double-gate structure or minimizes the generation of parasitic capacitance or parasitic voltage to increase the on-state current.

The source 2 and the drain 1 each include a main body 101, a longitudinal extension 102, and a lateral extension 103. The longitudinal extension 102 is connected to a side, facing the drain 1, of the main body 101 of the source 2, or disposed on a side, facing the source 2, of the main body 101 of the drain 1. The lateral extension 103 is connected to a top of the longitudinal extension 102. The top is an end of the longitudinal extension 102 distal from the substrate.

Inner edges of the lateral extension 103 of the source 2 and the lateral extension 103 of the drain 1 are aligned or approximately aligned with edges on both sides of the first gate. That is, in the plane where the surface of the first gate is disposed, a distance between a projection of the inner edge of the lateral extension of the source and a projection of a side edge, proximal to the inner edge of the lateral extension of the source, of the first gate is less than a distance threshold, and a distance between a projection of the inner edge of the lateral extension of the drain and a projection of a side edge, proximal to the inner edge of the lateral extension of the drain, of the first gate is less than the distance threshold.

The distance threshold may be determined based on a length of the first gate, for example, 5% of the length of the first gate.

It should be noted that in order to improve the conductivity of the thin-film transistor, the area of the gate can be increased, but while increasing the area of the gate, an overlapped part may be formed between the source 2 and the gate and between the drain 1 and the gate, in which a parasitic capacitance of the transistor appears, thereby leading to coupling.

According to the present disclosure, the overlapped area of the gate and the drain 1 and the overlapped area of the gate and the source 2 can be controlled by forming the protrusive structure between the source 2 and the drain 1 to reduce generation of the parasitic capacitance and parasitic voltage between the gate and the source 2 or between the gate and the drain 1.

The meaning of parasitic is that a capacitor is not originally designed in a place, but because there is always mutual capacitance between the component wiring patterns, it seems to be parasitic between the wires. In the case that the parasitic capacitance or the parasitic voltage exceeds a specific magnitude, the impact on the component is very large. In the embodiment of the present disclosure, projections of the source and the drain and the top gate plane are not overlapped with the first gate 4, and thus no parasitic capacitance or parasitic voltage is generated. In the case that the projections of the source and the drain on the plane where the top gate surface is disposed and the projection of the first gate 4 on the plane are approximately not overlapped, parasitic capacitance or parasitic voltage may be generated, which, however, exerts a little impact on the transistor, and there is no need to consider the parasitic capacitance or parasitic voltage. In some embodiments, "approximately not overlapped" can be constrained to mean that the total overlapped area of the first gate and the source-drain metal is 0 to 20% of a sum of areas of the projection of the source, the projection of the drain, and the projection of the first gate, for example, 0 to 10%. In application, it can be set according to the frequency of the component.

That is, in the embodiment of the present disclosure, the area threshold is not greater than 20% of a sum of areas of the projection of the source, the projection of the drain, and the projection of the first gate.

Figure 2:
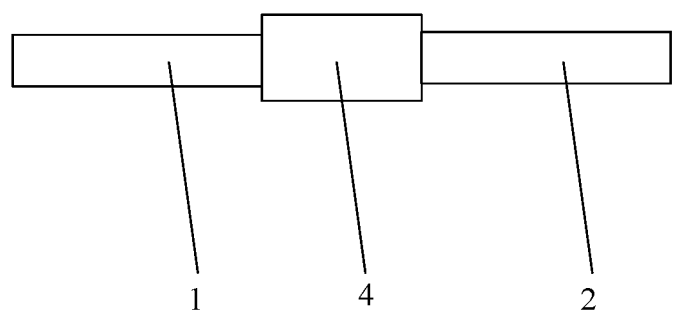
FIG. 2 is a schematic diagram of a positional relationship among a source, a drain and a first gate according to an embodiment of the present disclosure.

FIG. 2 is a schematic diagram of a positional relationship among a source, a drain and a first gate according to an embodiment of the present disclosure. Referring to FIG. 2, the inner edges of the source 2 and the drain 1 are aligned with the edges on either side of the first gate 4. In this case, in the plane where the surface of the first gate 4 is disposed, the projections of the source 2 and the drain 1 and the projection of the first gate 4 are not overlapped, and the overlapped area is zero. It should be noted that FIG. 4 only shows the positional relationship of the source, the drain, and the first gate, but does not limit the specific shapes and sizes of the source, the drain, and the first gate. Generally, the shapes of the above electrodes may be a regular or irregular pattern.

Capacitance can be expressed as $$C = \frac{\varepsilon_r \varepsilon_0 A}{d},$$

wherein $\varepsilon_r$ and $\varepsilon_o$ represent dielectric constant and electrical constant, respectively, A represents an overlapped area between two elements (e.g., plates) forming a capacitive element, and d represents a distance between the two elements. As can be appreciated, the variables Er and $\varepsilon_o$ are usually constant depending on the selected material, and it may generally be undesirable to increase d because that would increase the thickness of the LCD panel.

In addition, it should be noted that, in the embodiments of the present disclosure, the consideration of the overlapped area of the source and the top gate and the overlapped area of the drain and the top gate is to improve the conductivity of the array substrate. In some embodiments, it can be considered to limit the area of the top gate while the TFT array substrate satisfies conductivity performance such that the area of the first gate 4 is small, and the gate is formed under a blank position between the lateral extensions 103 at the relative position of the drain 1 and the source 2. No matter how the area of the gate is adjusted, it falls within the scope of protection of the present disclosure on the premise of not violating the principles of the present disclosure.

In some embodiments, the TFT array substrate has a single-gate structure, and as shown in FIG. 1, further includes a substrate 100. A first planarization layer 300, a first buffer layer 400, a first interlayer dielectric layer 500, and a third planarization layer 600 are sequentially disposed on the substrate 100. A light-shielding layer 200 is disposed between the substrate 100 and the first planarization layer 300. The first planarization layer 300 covers the light-shielding layer 200. An active layer 3 is disposed between the first buffer layer 400 and the first interlayer dielectric layer 500. A first gate insulating layer 5 is disposed between the first gate 4 and the active layer 3. A second interlayer dielectric layer 501 is filled around the first gate 4 and the first gate insulating layer 5 in the protrusive structure.

It should be noted that the drain 1 and the source 2 are in contact with the active layer 3 through a first via hole A and a second via hole B provided on the first interlayer dielectric layer 500. A spacing between the first via hole and the second via hole defines a channel length. The protrusive structure according to the embodiment of the present disclosure can be adapted to different channel lengths W. The different channel lengths W can be adjusted by adjusting the positions of the main bodies 101 of the source and the drain. The height of the protrusive structure can be adjusted by adjusting the height of the longitudinal extension 102, such that the height of the first gate 4 can be adjusted and the distance between the first gate 4 and the active layer 3 can be adjusted. The width area of the first gate 4 can be adjusted by adjusting the distance between the lateral extensions 103.

In the embodiment of the present disclosure, the TFT array substrate further includes an anode 6 disposed on the drain 1 or the source 2, and a cathode 7 disposed on the substrate 100. In this embodiment, the anode 6 is disposed above the third planarization layer 600, and is connected to the source 2 through an anode via hole C disposed on the third planarization layer 600. A part of the cathode 7 is disposed above the third planarization layer 600 and is connected to the other part of the cathode 7 on the substrate 100 through a cathode via hole D disposed on the third planarization layer 600, the first interlayer dielectric layer 500 and the buffer layer 400.

The substrate 100 is also provided with a boss 8. The cathode 7 is disposed on the boss 8, and extends from an upper surface of the boss 8 along a side surface of the boss 8 to the outside of the boss 8 on the surface of the substrate 100. The cathode 7 may extend below the source and the drain and the protrusive structure between the source and the drain. In this case, the cathode 7 may be used as the light-shielding layer 200. The light-shielding layer 200 can prevent the active layer 3 from photocurrent caused by external light.

In the case that the anode 6 and/or the cathode 7 are transparent electrodes, the anode 6 and/or the cathode 7 may be formed of, for example, ITO, IZO, ZnO, or $In_2O_3$. In the case that the anode 6 and/or the cathode 7 are reflective electrodes, the anode 6 and/or the cathode 7 may include, for example, a reflective film formed of Ag, Mg, Al, Pt, Pd, Au, Ni, Nd, Ir, Cr, or a mixture thereof and a transparent film formed of ITO, IZO, ZnO, or $In_2O_3$. In an exemplary embodiment, the anode 6 and/or the cathode 7 may have a stacked structure of ITO/Ag/ITO.

Figure 3:
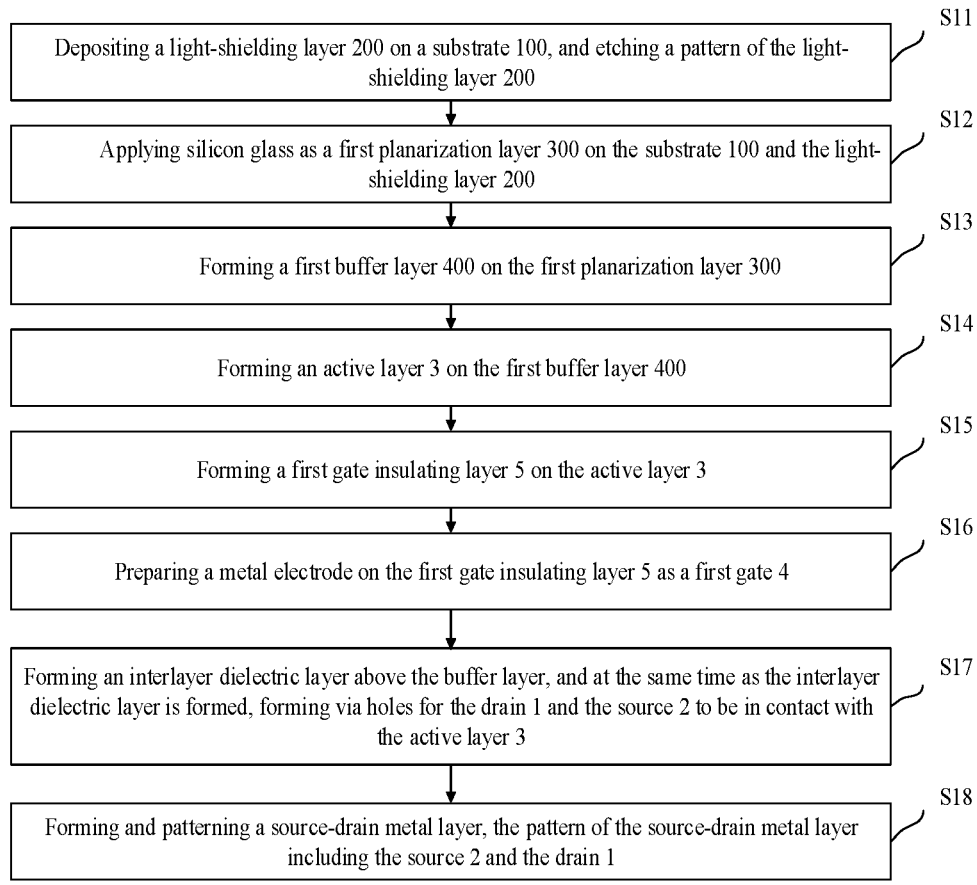
FIG. 3 is a flowchart of a method for preparing a TFT array substrate according to an embodiment of the present disclosure.

FIG. 3 is a flow chart of a method for preparing a TFT array substrate according to an embodiment of the present disclosure, which is used to prepare the TFT array substrate as described above. Referring to FIG. 3, the method includes the following steps.

In S11, the light-shielding layer 200 (LS) is deposited on the substrate 100, and then a pattern of the light-shielding layer 200 is etched.

The light-shielding layer 200 can prevent the active layer 3 from the phenomenon of photocurrent caused by external light. The light-shielding layer 200 may be made of metal or amorphous silicon (a-Si). Amorphous silicon (a-Si) can absorb the entire wavelength of light, which can not only achieve the light-shielding effect on the TFT active layer 3, but also has no problems of metal reflection and being susceptible to heat.

In S12, silicate glass is coated as the first planarization layer 300 on the substrate 100 and the light-shielding layer 200. The coating method is spin coating.

By curing an SOG (spin on glass coating) layer, the SOG layer is turned into a silicon oxide layer with a flat surface. SOG is to uniformly coat a liquid solvent containing a dielectric material in a spin coating fashion on a wafer surface to fill recessed holes in the deposited dielectric layer. Then, after heat treatment, the solvent may be removed, leaving a dielectric material similar to silicon dioxide ($SiO_2$) upon curing on the wafer surface.

In S13, the first buffer layer 400 is formed on the first planarization layer 300.

The material of the buffer layer includes but is not limited to dielectric materials such as silicon oxide (SiOx), silicon nitride (SiNx), silicon oxynitride (SiON), or new organic insulating materials such as polysiloxane-based materials, acrylic-based materials, or polyimide-based materials, and the like, or high-dielectric constant materials such as aluminum oxide (AlOx), hafnium oxide (HfOx), tantalum oxide (TaOx), and the like.

In S14, the active layer 3 is formed on the first buffer layer 400.

For example, an amorphous silicon layer is deposited on the buffer layer; the amorphous silicon layer is patterned; and the amorphous silicon layer is turned into a polysilicon (Poly-Si) layer by an excimer laser annealing process.

The active layer 3 may be made of a metal oxide semiconductor material, such as indium gallium zinc oxide (IGZO), indium zinc tin oxide (IZTO), or indium gallium zinc tin oxide (IGZTO). It may also be an amorphous silicon (a-Si) semiconductor layer, a polysilicon (p-Si) semiconductor layer, or an organic semiconductor layer.

In S15, the first gate insulating layer 5 is formed on the active layer 3.

For example, using a chemical vapor deposition method, the gate insulating layer is continuously deposited on the active layer 3. The material of the gate insulating layer is usually silicon nitride. Silicon oxide and silicon oxynitride may also be used, or aluminum oxide may also be used.

In S16, a metal electrode is prepared on the first gate insulating layer 5 as the first gate 4.

Metals such as molybdenum, aluminum-neodymium alloy, aluminum-nickel alloy, molybdenum-tungsten alloy, chromium or copper are usually used as the gate metal material for preparing the gate. A gate mask plate is adopted. For example, through an exposure process and a chemical etching process, a gate as a gate pattern is formed in a specific region of the gate insulating layer.

The material of the gate may include at least one metal selected from, for example, molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu). However, the material of the gate is not limited to this.

The preparation method for the gate is to prepare a mask by photolithography or other methods, then form a metal layer by metal evaporation or sputtering or other methods, and complete the preparation of the gate by a metal stripping process, or form the metal layer first, then prepare the mask, and prepare the gate by a metal etching technique.

In S17, an interlayer dielectric layer is formed above the buffer layer (or the second gate insulating layer), and via holes for the drain 1 and the source 2 to be in contact with the active layer 3 are formed while forming the interlayer dielectric layer, wherein the interlayer dielectric layer covers the first gate 4 and the first gate insulating layer 5.

In an exemplary embodiment, a PHO/Dry/STR process can be adopted for patterning to form the via hole pattern therein.

In S18, a source-drain metal layer is formed and patterned, wherein the pattern of the source-drain metal layer includes the source 2 and the drain 1.

The source 2 and the drain 1 each include a main body formed by the via hole on the interlayer dielectric layer, a longitudinal extension disposed on an opposite side of the main body 101 of the source 2 and the drain 1, and a lateral extension 103 disposed at the top of the longitudinal extension 102.

The thin-film transistor in the TFT-LCD pixel structure controls the operating state of the entire pixel and plays an important role in the pixel structure. TFT pixel charge retention is one of the important display parameters of TFT-LCD. The pixel charge retention is significantly correlated with the off-state characteristics of the TFT device. The larger the off-state resistance of the thin-film transistor is, that is, the smaller the off-state current is, the longer the maintenance time of the pixel charge is.

Calculation formula of off-state current Ioff:

$$I_{off} = q(n\mu_e + p\mu_p)\frac{W}{L}d_s V_{DS},$$

wherein q, n, p, $\mu_e$, $\mu_p$, and ds are the amount of electron charge, electron density, hole density, electron mobility, hole mobility, and the thickness of the active layer 3, respectively.

From the above, it can be seen from the device structure that the off-state current Ioff is related to the width-to-length ratio W/L of the thin-film transistor and the thickness ds of the active layer 3. Without considering other factors, reducing the ratio of the width-to-length ratio W/L and the thickness ds of the active layer 3 is an effective way to reduce the off-state current.

The effective channel length remains unchanged, and thus a short circuit in the device or an increase in leakage current may not be caused. While keeping the source-drain width unchanged and the effective channel length not affected, the source-drain depth is increased, thereby reducing the source-drain resistance, and greatly reducing the source-drain parasitic resistance.

Figure 4:
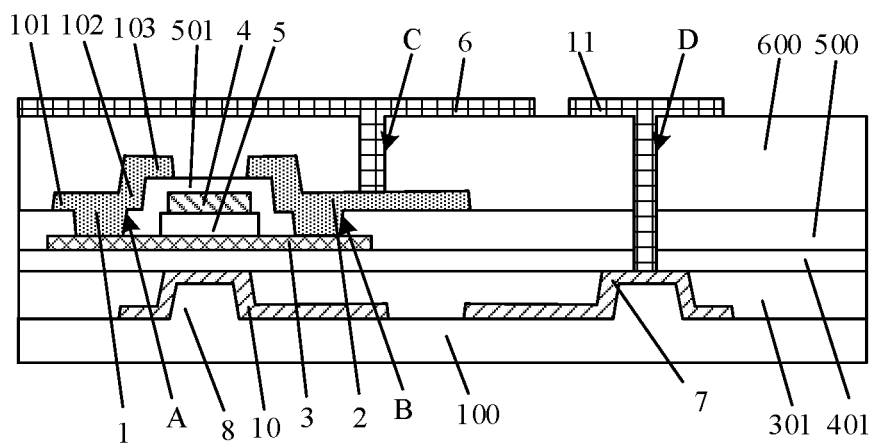
FIG. 4 is a schematic structural diagram of another TFT array substrate according to an embodiment of the present disclosure.

In some embodiments, the TFT array substrate has a double-gate structure. As shown in FIG. 4, compared to a single gate structure, it further includes a second gate 10 disposed on the substrate 100. The substrate 100 includes the boss 8 mated with the second gate 10. The second gate 10 covers the boss 8. The second gate 10 is disposed at a corresponding position on a side, proximal to the substrate, of the protrusive structure. A width of the second gate 10 is less than a width of a channel formed by the source 2 and the drain on the active layer 3. The second gate 10 covers a side surface of the boss 8 and extends on the substrate to the outside of the boss 8 on the substrate 100.

Referring to FIG. 4, the TFT array substrate includes the substrate 100. A second planarization layer 301, a second buffer layer 401 or a second gate insulating layer, a first interlayer dielectric layer 500, and a third planarization layer 600 are sequentially disposed on the substrate 100. The second planarization layer 301 does not cover an upper surface of the second gate 10. The second buffer layer 401 or the second gate insulating layer is disposed between the second gate 10 and the active layer 3.

In the embodiment of the present disclosure, the TFT array substrate further includes the anode 6 disposed on the drain 1 or the source 2, and the cathode 7 disposed on the substrate 100. In this embodiment, the anode 6 is disposed above the third planarization layer 600, and is connected to the source 2 through the anode via hole C disposed on the third planarization layer 600. A part 11 of the cathode 7 is disposed above the third planarization layer 600, and is connected to the other part of the cathode 7 on the substrate 100 through the cathode via hole D disposed on the third planarization layer 600, the first interlayer dielectric layer 500 and the buffer layer 400.

The substrate 100 is also provided with another boss 8. The cathode 7 is disposed on the boss 8, and extends from an upper surface of the boss 8 along a side surface of the boss 8 to the outside of the boss 8 on the surface of the substrate 100. The cathode 7 extends on the substrate 100 but is not in contact with the second gate 10. In this case, the cathode 7 may be used as the light-shielding layer 200. The light-shielding layer 200 can prevent the active layer 3 from the phenomenon of photocurrent caused by external light.

In the case that the anode 6 and/or the part 11 of the cathode 7 are transparent, the anode 6 and/or the part 11 of the cathode 7 may be formed of, for example, ITO, IZO, ZnO, or $In_2O_3$. In the case that the anode 6 and/or the part 11 of the cathode 7 are reflective, the anode 6 and/or the part 11 of the cathode 7 may include, for example, a reflective film formed of Ag, Mg, Al, Pt, Pd, Au, Ni, Nd, Ir, Cr or a mixture thereof and a transparent film formed of ITO, IZO, ZnO or $In_2O_3$. In an exemplary embodiment, the anode 6 and/or the part 11 of the cathode 7 may have a stacked structure of ITO/Ag/ITO.

Figure 5:
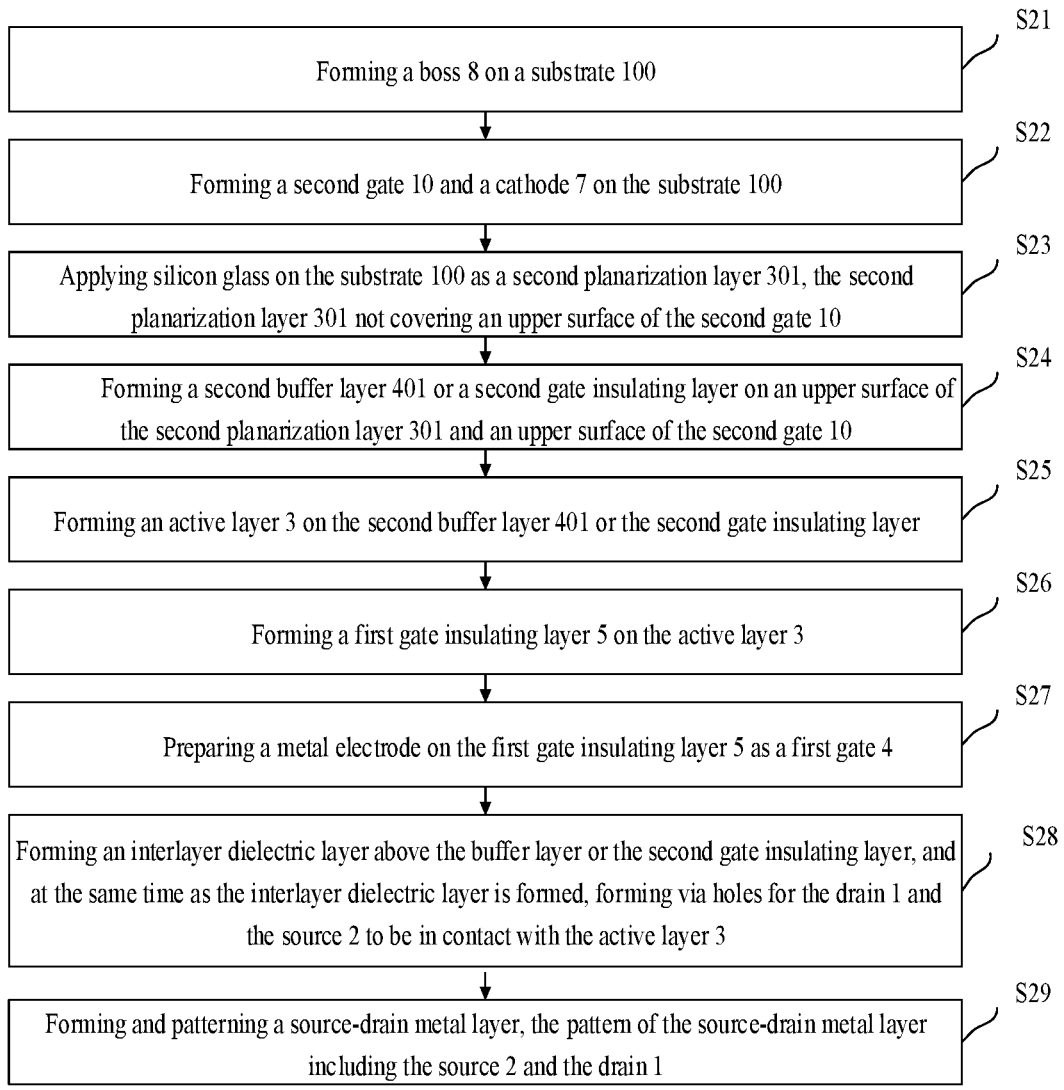
FIG. 5 is a flowchart of a method for preparing a TFT array substrate according to an embodiment of the present disclosure.

FIG. 5 is a flow chart of a method for preparing a TFT array substrate according to an embodiment of the present disclosure, which is used to prepare the TFT array substrate as described above. Referring to FIG. 5, the method includes the following steps.

Figure 6:
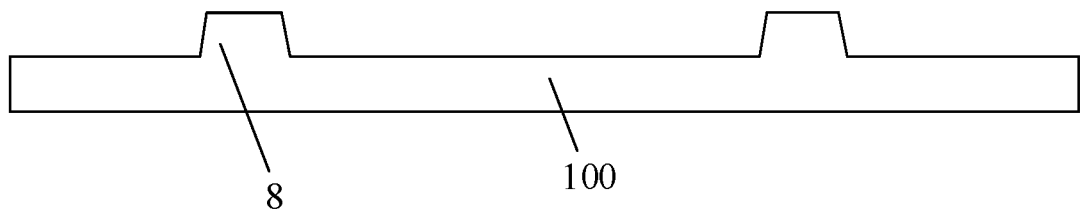
FIG. 6 is a schematic diagram of step S21 of the method for preparing the a TFT array substrate according to an embodiment of the present disclosure.

In S21, as shown in FIG. 6, the boss 8 is formed on the substrate 100.

The substrate 100 may be a glass substrate or a plastic substrate. For different types of substrates 100, the boss 8 may be formed by different methods.

In some embodiments, the substrate 100 is a glass substrate. The method for forming the boss 8 on the substrate 100 includes: forming the boss 8 by etching; or forming the boss 8 by photolithography using a high heat-resistant adhesive material.

In some embodiments, the substrate 100 is a plastic substrate. The method for forming the boss 8 on the substrate 100 includes: forming the boss 8 by half-tone exposure using a photosensitive PI material; or removing other parts of the substrate 100 outside the boss 8 by performing dry etching using a photomask; or forming the boss 8 by using a nanoimprint method.

Figure 7:
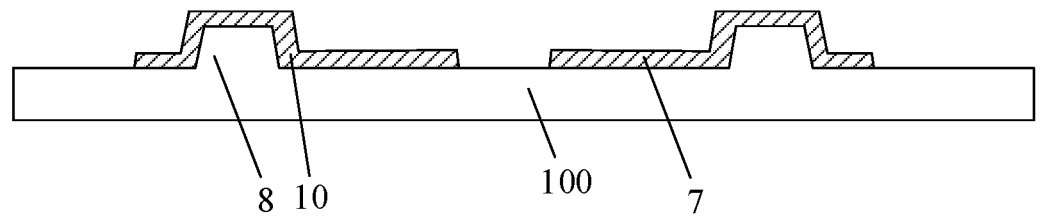
FIG. 7 is a schematic diagram of step S22 of the method for preparing the TFT array substrate according to an embodiment of the present disclosure.

In S22, as shown in FIG. 7, the second gate 10 and the cathode 7 are formed on the substrate 100.

Metals such as molybdenum, aluminum-neodymium alloy, aluminum-nickel alloy, molybdenum-tungsten alloy, chromium or copper are usually used as the gate metal material for preparing the gate. A gate mask plate is adopted. For example, through an exposure process and a chemical etching process, a gate as a gate pattern is formed in a specific region of the gate insulating layer.

The second gate 10 and the cathode 7 can also play a light-shielding effect to achieve a light-shielding effect on the TFT active layer 3.

Figure 8:
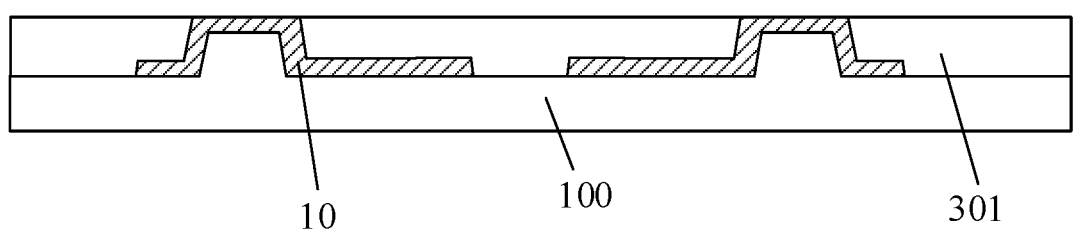
FIG. 8 is a schematic diagram of step S23 of the method for preparing the TFT array substrate according to an embodiment of the present disclosure.

In S23, as shown in FIG. 8, silicon glass is coated on the substrate 100 as the second planarization layer 301, and the second planarization layer 301 does not cover an upper surface of the second gate 10.

By curing an SOG (spin on glass coating) layer, the SOG layer is turned into a silicon oxide layer with a flat surface. SOG is to uniformly coat a liquid solvent containing a dielectric material in a spin coating fashion on a wafer surface to fill recessed holes in the deposited dielectric layer. Then, after heat treatment, the solvent may be removed, leaving a dielectric material similar to silicon dioxide ($SiO_2$) after curing on the wafer surface.

Figure 9:
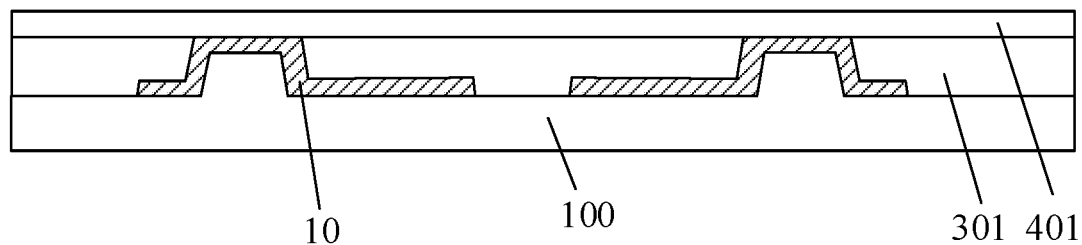
FIG. 9 is a schematic diagram of step S24 of the method for preparing the TFT array substrate according to an embodiment of the present disclosure.

In S24, as shown in FIG. 9, the second buffer layer 401 or the second gate insulating layer is formed on an upper surface of the second planarization layer 301 and an upper surface of the second gate 10.

The material of the insulating layer and the buffer layer includes but is not limited to dielectric materials such as silicon oxide (SiOx), silicon nitride (SiNx), silicon oxynitride (SiON), or new organic insulating materials such as polysiloxane-based materials, acrylic-based materials, or polyimide-based materials, and the like, or high-dielectric constant materials such as aluminum oxide (AlOx), hafnium oxide (HfOx), tantalum oxide (TaOx), and the like.

Figure 10:
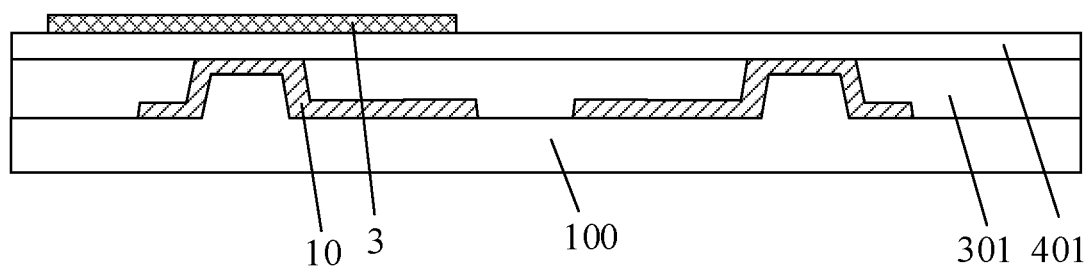
FIG. 10 is a schematic diagram of step S25 of the method for preparing the TFT array substrate according to an embodiment of the present disclosure.

In S25, as shown in FIG. 10, the active layer 3 is formed on the second buffer layer 401 or the second gate insulating layer.

For example, an amorphous silicon layer is deposited on the buffer layer; the amorphous silicon layer is patterned; and the amorphous silicon layer is turned into a polysilicon (Poly-Si) layer by an excimer laser annealing process.

The active layer 3 may be made of a metal oxide semiconductor material, such as indium gallium zinc oxide (IGZO), indium zinc tin oxide (IZTO), or indium gallium zinc tin oxide (IGZTO). It may also be an amorphous silicon (a-Si) semiconductor layer, a polysilicon (p-Si) semiconductor layer, or an organic semiconductor layer.

Figure 11:
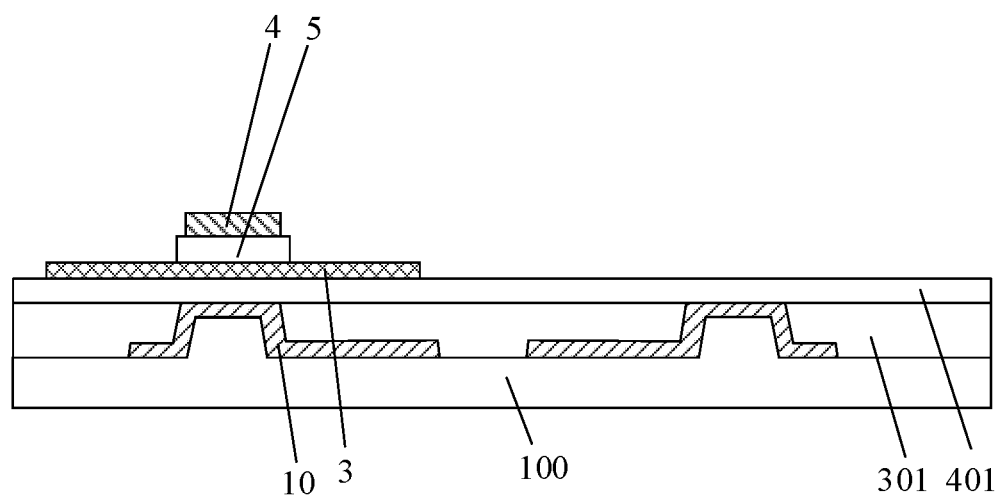
FIG. 11 is a schematic diagram of steps S26 and S27 of the method for preparing the TFT array substrate according to an embodiment of the present disclosure.

In S26, as shown in FIG. 11, the first gate insulating layer 5 is formed on the active layer 3.

For example, using a chemical vapor deposition method, the gate insulating layer is continuously deposited on the active layer 3. The material of the gate insulating layer is usually silicon nitride. Silicon oxide and silicon oxynitride may also be used, as well as aluminum oxide.

In S27, as shown in FIG. 11, a metal electrode is prepared on the first gate insulating layer 5 as the first gate 4.

Metals such as molybdenum, aluminum-neodymium alloy, aluminum-nickel alloy, molybdenum-tungsten alloy, chromium or copper are usually used as the gate metal material for preparing the gate. A gate mask plate is adopted. For example, through an exposure process and a chemical etching process, a gate as a gate pattern is formed in a specific region of the gate insulating layer.

The material of the gate may include at least one metal selected from, for example, molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu). However, the material of the gate is not limited to this.

The preparation method for the gate is to prepare a mask by photolithography or other methods, then form a metal layer by metal evaporation or sputtering or other methods, and complete the preparation of the gate by a metal stripping process, or form the metal layer first, then prepare the mask, and prepare the gate by a metal etching technique.

Figure 12:
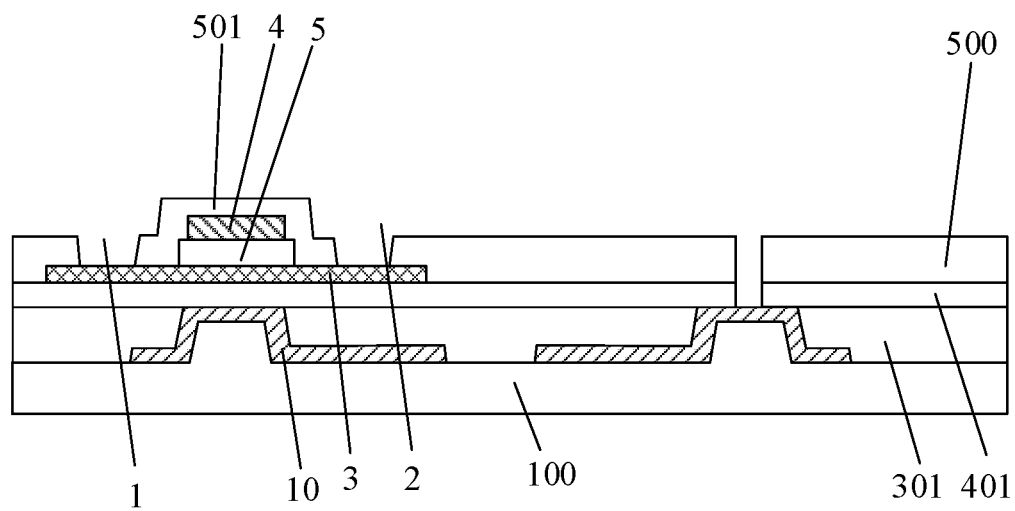
FIG. 12 is a schematic diagram of step S28 of the method for preparing the TFT array substrate according to an embodiment of the present disclosure.

In S28, as shown in FIG. 12, an interlayer dielectric layer is formed above the buffer layer or the second gate insulating layer, and via holes for the drain 1 and the source 2 to be in contact with the active layer 3 are formed while forming the interlayer dielectric layer, wherein the interlayer dielectric layer covers the first gate 4 and the first gate insulating layer 5.

In an exemplary embodiment, a PHO/Dry/STR process can be adopted for patterning to form the via hole pattern therein.

Figure 13:
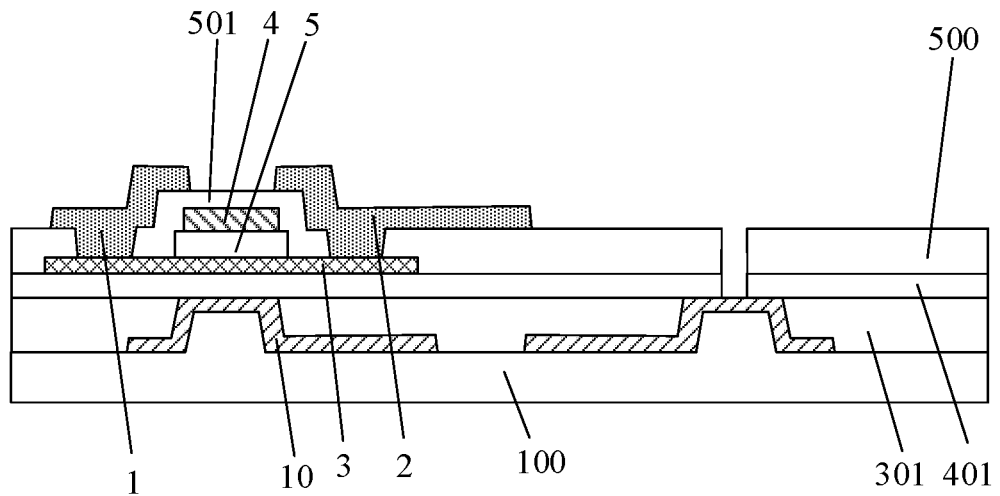
FIG. 13 is a schematic diagram of step S29 of the method for preparing the TFT array substrate according to an embodiment of the present disclosure.
Figure 14:
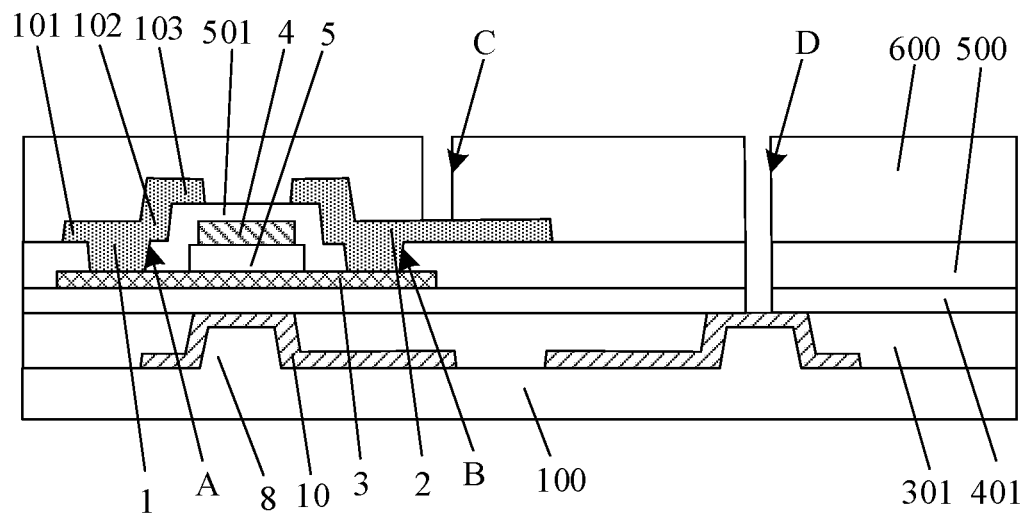
FIG. 14 is a schematic diagram of step S29 of the method for preparing the TFT array substrate according to an embodiment of the present disclosure.

In S29, as shown in FIGS. 13 and 14, a source-drain metal layer is formed and patterned, wherein the pattern of the source-drain metal layer includes the source 2 and the drain 1.

The source 2 and the drain 1 each include a main body formed by the via hole on the interlayer dielectric layer, a longitudinal extension disposed on an opposite side of the main body 101 of the source 2 and the drain 1, and a lateral extension 103 disposed at the top of the longitudinal extension 102.

In the field of display technologies, the patterning process may include only the photolithography process, or, the photolithography process and the etching process, and may also include printing, inkjet and other processes for preparing predetermined patterns; The engraving process refers to the process of forming patterns using photoresist, mask, exposure machine, etc., including film formation, exposure, development and other processes. The corresponding patterning process can be selected according to the structure formed in the present disclosure.

The double-gate structure is mainly used in TFTs to maintain stable Vth uniformity and increase Ion. The boss 8 made of the glass or plastic substrate is formed on the substrate, such that the bottom gate is covered above the boss 8, and the distance between the bottom gate and the active layer 3 is minimized, thereby minimizing the parasitic voltage. At the same time, in the protrusive structure area between the bottom gate and the upper source and drain, the bottom gate metal is placed under the area during design to minimize or suppress the generation of parasitic voltage (Cp, Cgs). In particular, in the case that the distance between the active layer 3 and the bottom gate metal reaches 1.7 um or more, parasitic capacitance is no longer generated.

Double-gate TFT can be used not only in the display area to increase the aperture ratio, but also in the array substrate row drive (gate-on-array, GOA) area to reduce the size of the gate-on-array area, thereby reducing the edge size of the display device. It is beneficial to realize the narrow frame of the display device.

The double-gate TFT can also be used in electro-static discharge (ESD) circuits to reduce the size of the electro-static discharge circuit and reduce the time required for discharge. The electro-static discharge circuit is a conductive loop composed of TFTs. Its function is to prevent static electricity that can damage the screen of the display device during the production and subsequent use of the product. If an instant high voltage appears to a specific trace on the array substrate, the current may be averaged across the entire array substrate through the electro-static discharge circuit.

Further, the present disclosure also provides a display device including the single-gate TFT array substrate and the double-gate TFT array substrate described above.

In some areas that require twice the W (channel width), double gates can be used to increase Ioff or minimize Cp and Cgs to increase Ion. In some pixel structures with large W differences, the solution according to the present disclosure can be applied to OLEDs that require small W or LEDs (uLED, QNED, and the like) that require large W, and the like, and can also be applied to Hybrid LED where a small number of sub-pixels in RGB sub-pixels adopt a small W and the remaining sub-pixels adopt a large W.

It should be understood that the orientation or positional relationship indicated by the terms "length," "width," "upper," "lower," "front," "rear," "left," "right," "vertical," "horizontal," "top," "bottom," "inner," "outer," or the like is based on the orientation or positional relationship shown in the drawings, and is only for the convenience of describing the present disclosure and simplifying the description, rather than indicating or implying that the device or element referred to must have a specific orientation, be configured and operated in a specific orientation, and therefore cannot be understood as a limitation of the present disclosure.

In addition, the terms "first" and "second" are only used for descriptive purposes, and shall not be understood as indicating or implying relative importance or implicitly indicating the number of technical features indicated. Thus, the features defined with "first" and "second" may explicitly or implicitly include one or more of these features. In the description of the present disclosure, "a plurality of" means two or more, unless explicitly defined otherwise.

Unless otherwise defined, the technical and scientific terms used herein have the same meanings as commonly understood by those skilled in the technical field of the present disclosure. The terminologies used herein are only for the purpose of description and are not intended to limit the present disclosure. Terms such as "provided" appearing herein can mean that one component is directly attached to another component, or that one component is attached to another component through an intermediate component. A feature described in one embodiment herein can be applied to another embodiment alone or in combination with other features, unless the feature is not applicable in the other embodiment or otherwise stated.

The present disclosure has been described through the above embodiments. It is understood that the above embodiments are only for the purpose of illustration and description, and are not intended to limit the present disclosure to the scope of the described embodiments. Those skilled in the art can understand that more variations and modifications may be made according to the teachings of the present disclosure, and these variations and modifications fall within the scope of protection claimed by the present disclosure.

What is claimed is:

1. A thin-film transistor (TFT) array substrate, comprising a source, a drain, and a first gate; wherein
   a protrusive structure is defined between the source and the drain, and the first gate is disposed inside the protrusive structure; and
   in a plane where a surface of the first gate is disposed, a sum of an overlapped area of a projection of the source and a projection of the first gate and an overlapped area of a projection of the drain and the projection of the first gate is less than an area threshold,
   the TFT array substrate further comprising a substrate and a second gate, wherein the substrate is provided with a boss mated with the second gate, and the second gate covers the boss, wherein the second gate is disposed at a corresponding position on a side, proximal to the substrate, of the protrusive structure, wherein a width of the second gate is less than a width of a channel formed by the source and the drain on an active layer, the second gate is closer to the substrate than the first gate is, orthographic projections of the first gate and the second gate on the substrate are overlapped, a second planarization layer is disposed on the substrate, the second planarization layer does not cover an upper surface of the second gate, and an upper surface of the second planarization layer is flush with the upper surface of the second gate,
   the TFT array substrate further comprising a cathode disposed on the substrate, wherein the second gate and the cathode are disposed on a same layer and formed by a same step.

2. The TFT array substrate according to claim 1, wherein the area threshold is not greater than 20% of a sum of areas of the projection of the source, the projection of the drain, and the projection of the first gate.

3. The TFT array substrate according to claim 1, wherein the sum of the overlapped area of the projection of the source and the projection of the first gate and the overlapped area of the projection of the drain and the projection of the first gate is zero.

4. The TFT array substrate according to claim 1, wherein the source and the drain each comprise a main body, a longitudinal extension, and a lateral extension, wherein the longitudinal extension of the source is connected to a side, facing the drain, of the main body of the source, the longitudinal extension of the drain is connected to a side, facing the source, of the main body of the drain, and the lateral extension is connected to a top of the longitudinal extension.

5. The TFT array substrate according to claim 4, wherein, in the plane where the surface of the first gate is disposed, a distance between a projection of an inner edge of the lateral extension of the source and a projection of a side edge, proximal to the inner edge of the lateral extension of the source, of the first gate is less than a distance threshold, and a distance between a projection of an inner edge of the lateral extension of the drain and a projection of a side edge, proximal to the inner edge of the lateral extension of the drain, of the first gate is less than the distance threshold.

6. The TFT array substrate according to claim 1, wherein the second gate covers a side surface of the boss and extends on the substrate to the outside of the boss.

7. A method for preparing a thin-film transistor (TFT) array substrate, comprising:
   forming a source, a drain and a first gate; wherein
   a protrusive structure is defined between the source and the drain, and the first gate is disposed inside the protrusive structure; and
   in a plane where a surface of the first gate is disposed, a sum of an overlapped area of a projection of the source and a projection of the first gate and an overlapped area of a projection of the drain and the projection of the first gate is less than an area threshold,
   the TFT array substrate further comprising a substrate and a second gate, wherein the substrate is provided with a boss mated with the second gate, and the second gate covers the boss, wherein the second gate is disposed at a corresponding position on a side, proximal to the substrate, of the protrusive structure, wherein a width of the second gate is less than a width of a channel formed by the source and the drain on an active layer, the second gate is closer to the substrate than the first gate is, orthographic projections of the first gate and the second gate on the substrate are overlapped, a second planarization layer is disposed on the substrate, the second planarization layer does not cover an upper surface of the second gate, and an upper surface of the second planarization layer is flush with the upper surface of the second gate,
   the TFT array substrate further comprising a cathode disposed on the substrate, wherein the second gate and the cathode are disposed on a same layer and formed by a same step.

8. The method according to claim 7, wherein the area threshold is not greater than 20% of a sum of areas of the projection of the source, the projection of the drain, and the projection of the first gate.

9. The method according to claim 7, wherein the sum of the overlapped area of the projection of the source and the projection of the first gate and the overlapped area of the projection of the drain and the projection of the first gate is zero.

10. The method according to claim 7, wherein the source and the drain each comprise a main body, a longitudinal extension, and a lateral extension, wherein the longitudinal extension of the source is connected to a side, facing the drain, of the main body of the source, the longitudinal extension of the drain is connected to a side, facing the source, of the main body of the drain, and the lateral extension is connected to a top of the longitudinal extension.

11. A display device, comprising a thin-film transistor (TFT) array substrate, wherein the TFT array substrate comprises a source, a drain, and a first gate; wherein
   a protrusive structure is defined between the source and the drain, and the first gate is disposed inside the protrusive structure; and
   in a plane where a surface of the first gate is disposed, a sum of an overlapped area of a projection of the source and a projection of the first gate and an overlapped area of a projection of the drain and the projection of the first gate is less than an area threshold,
   the TFT array substrate further comprising a substrate and a second gate, wherein the substrate is provided with a boss mated with the second gate, and the second gate covers the boss, wherein the second gate is disposed at a corresponding position on a side, proximal to the substrate, of the protrusive structure, wherein a width of the second gate is less than a width of a channel formed by the source and the drain on an active layer, the second gate is closer to the substrate than the first gate is, orthographic projections of the first gate and the second gate on the substrate are overlapped, a second planarization layer is disposed on the substrate, the second planarization layer does not cover an upper surface of the second gate, and an upper surface of the second planarization layer 301 is flush with the upper surface of the second gate,
   the TFT array substrate further comprising a cathode disposed on the substrate, wherein the second gate and the cathode are disposed on a same layer and formed by a same step.

12. The display device according to claim 11, wherein the area threshold is not greater than 20% of a sum of areas of the projection of the source, the projection of the drain, and the projection of the first gate.

13. The display device according to claim 11, wherein the sum of the overlapped area of the projection of the source and the projection of the first gate and the overlapped area of the projection of the drain and the projection of the first gate is zero.

14. The display device according to claim 11, wherein the source and the drain each comprise a main body, a longitudinal extension, and a lateral extension, wherein the longitudinal extension of the source is connected to a side, facing the drain, of the main body of the source, the longitudinal extension of the drain is connected to a side, facing the source, of the main body of the drain, and the lateral extension is connected to a top of the longitudinal extension.

15. The display device according to claim 14, wherein, in the plane where the surface of the first gate is disposed, a distance between a projection of an inner edge of the lateral extension of the source and a projection of a side edge, proximal to the inner edge of the lateral extension of the source, of the first gate is less than a distance threshold, and a distance between a projection of an inner edge of the lateral extension of the drain and a projection of a side edge, proximal to the inner edge of the lateral extension of the drain, of the first gate is less than the distance threshold.

16. The display device according to claim 11, wherein the second gate covers a side surface of the boss and extends on the substrate to an outside of the boss.

17. The TFT array substrate according to claim 1, wherein the cathode extends on the substrate, and the cathode is used as a light-shielding layer to prevent the active layer from photocurrent caused by external light.

\* \* \* \* \*